United States Patent [19]

Hartig et al.

[11] Patent Number: 5,071,535
[45] Date of Patent: Dec. 10, 1991

[54] CATHODE SPUTTERING DEVICE

[75] Inventors: Klaus Hartig, Ronneburg; Joachim Szczyrbowski, Goldbach, both of Fed. Rep. of Germany

[73] Assignee: Leybold Aktiengesellschaft, Hanau, Fed. Rep. of Germany

[21] Appl. No.: 567,946

[22] Filed: Aug. 15, 1990

[30] Foreign Application Priority Data

May 14, 1990 [DE] Fed. Rep. of Germany ....... 4015388

[51] Int. Cl.$^5$ ............................................. C23C 14/34
[52] U.S. Cl. ............................ 204/298.09; 204/298.12
[58] Field of Search ........................ 204/192.12, 298.09, 204/298.12, 298.15

[56] References Cited

U.S. PATENT DOCUMENTS

| | | | |
|---|---|---|---|
| 4,290,876 | 9/1981 | Nishiyama et al. | 204/298.12 X |
| 4,430,190 | 2/1984 | Eilers et al. | 204/298.09 X |
| 4,434,042 | 2/1984 | Keith | 204/298.09 |
| 4,448,652 | 5/1984 | Pachomik | 204/298.09 |

FOREIGN PATENT DOCUMENTS

| | | |
|---|---|---|
| 3810175 | 10/1989 | Fed. Rep. of Germany . |
| 672319 | 11/1989 | Switzerland . |
| 0823459 | 4/1981 | U.S.S.R. ......................... 204/298.09 |

Primary Examiner—Nam X. Nguyen
Attorney, Agent, or Firm—Felfe & Lynch

[57] ABSTRACT

Cathode sputtering apparatus with a high sputtering rate, including a cathode having a cathode base 1 and a target 6 disposed parallel thereto and being provided with a channel 5 in the cathode base which is passed through by a cooling agent 12. With respect to the target 6, 10 to be cooled, this channel 5 is bounded by a thin wall 2 configured as a membrane. The wall 2 has large contact surfaces exhibiting a good heat transfer to the target surface. The contact surface between the target 6 and the wall 2 is coated with a material, e.g. a graphite layer, which has a low sputtering rate in order to delay a sputtering through as long as possible.

4 Claims, 1 Drawing Sheet

CATHODE SPUTTERING DEVICE

The invention relates to a cathode sputtering apparatus with a high sputtering rate including a cathode having a cathode base and a target disposed parallel thereto. Further, in the cathode base, the cathode is provided with channels through which a cooling agent passes. The channels are bounded with respect to the target to be cooled by a thin wall, and the wall has large contact surfaces exhibiting good thermal conductivity to the target surface.

BACKGROUND OF THE INVENTION

Cathode sputtering apparatus with a high sputtering rate are generally known where the heat is transferred according to the principle of direct target cooling or by linking the target to a cooled carrier plate.

Further, a cathode sputtering apparatus is known (P 39 37 588.7) where the cooling channels disposed in a carrier plate contain pipes which have thin walls and are passed through by a cooling agent. The cross sectional profiles of these pipes correspond to the cross sectional profiles of the cooling channels so that with their outer walls, the pipes establish a contact with the inner surfaces of the cooling channels and with the outer surfaces of the cathode.

A particular disadvantage of these known apparatus is unfavorable cooling agent-(e.g. water)-vacuum seals or an insufficient contact of cooled carrier plate and target which is due to constructional reasons. When using the device where thin-walled pipes are passed through by a cooling agent, it is disadvantageous that the target is sputtered through, and due to the small thickness of the cooling pipes and/or the wall bounding the cooling channels, the walls of the pipes are also immediately sputtered through. Subsequently, the cooling agent (water) conducted in the cooling pipe will intrude in the vacuum chamber, not described in further detail, which surrounds the interior of the cathode sputtering apparatus. This causes a shutdown of the entire apparatus and requires repair works which always involves significant costs.

SUMMARY OF THE INVENTION

It is an object of the present invention to further improve a cathode sputtering apparatus so that a sputtering through of the pipes conducting the cooling agent is delayed as long as possible thus avoiding a subsequent intrusion of cooling agent.

This object is accomplished in accordance with the invention in that the contact surface between the target and the wall is coated with a material which has a low sputtering rate.

Advantageously, the coating of the contact surface, with graphite for example, significantly delays the time until the wall (membrane) is sputtered through and the heat transfer from the target to the cooling agent may even be improved.

Advantageously, the layer to be coated, e.g. graphite which can be used in a UHV, can be applied by spraying from a commercially available spray can. This can be repeated as many times as desired.

Moreover, it is advantageous that the thin wall bounding the cooling channels can be formed like a membrane and during pressure build-up of the cooling agent, it fits closely to the target surface facing toward it. There is hence an excellent heat transfer between target and cooling agent.

BRIEF DESCRIPTION OF THE DRAWING

The invention allows the most various embodiments two of which are represented in greater detail in the attached drawing wherein.

DESCRIPTION OF THE PREFERRED EMBODIMENT

Figure 1:
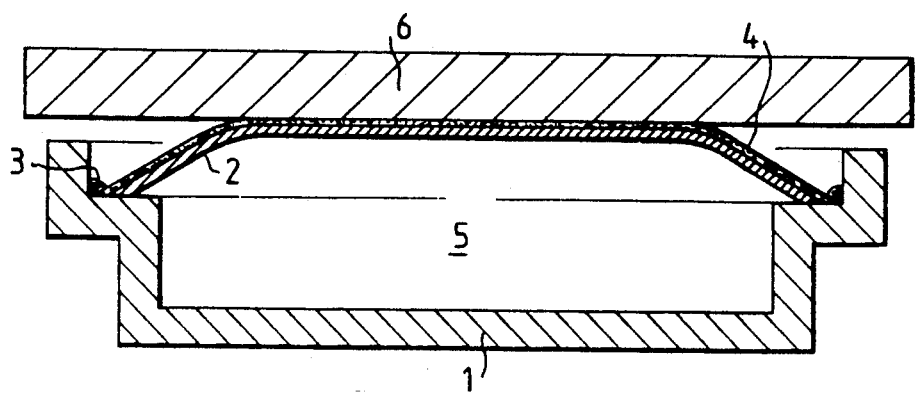
FIG. 1 is partial section of a cathode with a cooling membrane and FIG. 2 is a partial section of a cathode with a cooling pipe.

The internal surface of the trough-like cathode base 1, preferably made of stainless steel, is characterized by a mirror-symmetrical, step-like configuration. On the two opposing top steps extending in horizontal direction, there is a thin-walled, flexible membrane 2 preferably also made of stainless steel. The membrane is disposed such that with a defined arc directed toward the top, it extends over the two outer, perpendicular ends of the cathode base 1. A welding seam 3 connects the membrane 2 at its outer ends vacuum-tight to the base 1. The one side of the membrane which is directed toward the top is provided with a graphite layer 4. The channel 5 formed by the inner surfaces of the base 1 and the membrane 2 is passed through by a cooling agent. Because of the excessive pressure of the cooling agent flowing through the channel 5, the pressure being excessive with respect to the environment, the graphite-coated outer side 4 of the flexible membrane 2 is pressed against a flat target 6 which, a defined way, is disposed above and parallel to the cathode base 1 (FIG. 1).

Figure 2:
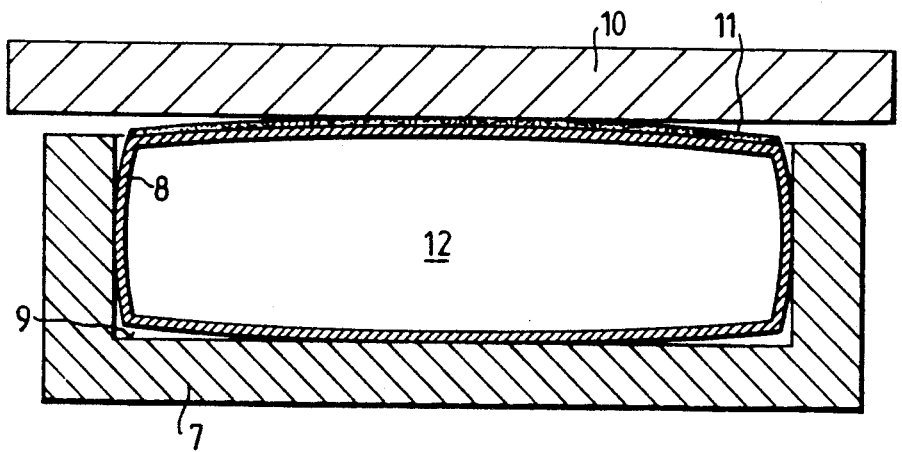

As seen in FIG. 2, in the channel 9 which is formed by the U-like cathode base 7, there is thin-walled, flexible cooling pipe 8, preferably made of stainless steel. It has a rectangular cross section and is inserted such that the three outer surfaces of the cooling pipe 8 contact for the most part the inner surfaces of the channel 9. The top side of the pipe 8 which faces the target 10 is on its outer side provided with a graphite layer. The cooling water 12 flowing in the inside of tube 8 presses this side against the bottom of a target 10 disposed at a defined distance with respect to the cathode base 7.

We claim:

1. Cathode sputtering apparatus with a high sputtering rate comprising: a cathode having a cathode base and a target disposed parallel thereto and being provided with channels in the cathode base which are passed through by a cooling agent, these channels being bounded with respect to the target to be cooled by a thin wall and this wall having a large contact surface exhibiting a good heat transfer to the target surface, the contact surface between the target and the wall being coated with graphite which has a lower sputtering rate than the sputtering rate of the target.

2. Cathode sputtering device in accordance with claim 1, in which the wall is made of a sheet metal piece cut to length having edges thereof firmly attached to the base in a vacuum-tight manner, whereby the wall can be deformed in the manner of a membrane and when pressure is increased, the wall fits closely to the target side facing the wall.

3. Cathode sputtering apparatus in accordance with claim 1 in which one side of the target facing the wall is coated.

4. Cathode sputtering apparatus in accordance with claim 1 in which one side of the wall facing the target is coated.

* * * * *